US009443786B1

(12) United States Patent
Rippel et al.

(10) Patent No.: US 9,443,786 B1
(45) Date of Patent: Sep. 13, 2016

(54) PACKAGING AND COOLING METHOD AND APPARATUS FOR POWER SEMICONDUCTOR DEVICES

(71) Applicant: AC PROPULSION, INC., San Dimas, CA (US)

(72) Inventors: Wally E. Rippel, Altadena, CA (US); Paul F. Carosa, Covina, CA (US); George R. Woody, Anaheim, CA (US); Lon C. Cooper, Azusa, CA (US); David L. Bogdanchik, Pasadena, CA (US)

(73) Assignee: AC Propulsion, Inc., San Dimas, CA (US)

( * ) Notice: Subject to any disclaimer, the term of this patent is extended or adjusted under 35 U.S.C. 154(b) by 0 days.

(21) Appl. No.: 14/830,684

(22) Filed: Aug. 19, 2015

(51) Int. Cl.
| | |
|---|---|
| *H01L 23/02* | (2006.01) |
| *H01L 23/367* | (2006.01) |
| *H01L 23/473* | (2006.01) |
| *H01L 23/373* | (2006.01) |
| *H01L 23/40* | (2006.01) |
| *H01L 23/467* | (2006.01) |
| *H01L 25/11* | (2006.01) |
| *H01L 23/42* | (2006.01) |

(52) U.S. Cl.
CPC ....... *H01L 23/3675* (2013.01); *H01L 23/3735* (2013.01); *H01L 23/3736* (2013.01); *H01L 23/4006* (2013.01); *H01L 23/4093* (2013.01); *H01L 23/42* (2013.01); *H01L 23/467* (2013.01); *H01L 23/473* (2013.01); *H01L 25/115* (2013.01); *H01L 2023/4018* (2013.01)

(58) Field of Classification Search
CPC . H01L 21/48; H01L 21/268; H01L 21/4828; H01L 21/3105; H01L 23/58; H01L 23/00; H01L 23/64; H01L 23/642
USPC ........................................ 257/686, 712–714
See application file for complete search history.

(56) References Cited

U.S. PATENT DOCUMENTS

| | | | | |
|---|---|---|---|---|
| 6,606,251 B1* | 8/2003 | Kenny, Jr. | ................. | G06F 1/26 257/E23.067 |
| 7,274,106 B2* | 9/2007 | Kim | ....................... | H01L 23/34 257/686 |
| 7,327,570 B2* | 2/2008 | Belady | .................. | H01L 23/473 165/185 |
| 7,355,277 B2* | 4/2008 | Myers | .................... | H01L 23/473 257/712 |
| 7,536,870 B2* | 5/2009 | Bezama | .............. | H01L 23/4735 62/259.2 |
| 8,413,712 B2* | 4/2013 | Brunschwiler | ..... | H01L 23/4735 165/80.2 |

(Continued)

*Primary Examiner* — Michael Lebentritt
(74) *Attorney, Agent, or Firm* — Charles C. H. Wu; Charles C.H. Wu & Assoc., APC (57) ABSTRACT

A packaging and cooling apparatus for power semiconductor devices comprising a printed circuit board and a semiconductor module. The semiconductor module having a manifold element and a semiconductor element consisting of power semiconductor devices, thermally conductive plates, and serpentine fin elements. The power semiconductor devices and serpentine fin elements are bonded to the thermally conductive plates on opposing sides to form plate assemblies. The plate assemblies are installed in the windows of the manifold element forming the semiconductor module, which allows for heat removal from each of the power semiconductor devices. The terminals of the semiconductor module are received in the holes of the circuit board, and soldered to traces. The packaging and cooling apparatus may be potted with a resin to prevent leakage of coolant or sealing may be achieved by use of clamped o-rings.

22 Claims, 8 Drawing Sheets

(56) References Cited

U.S. PATENT DOCUMENTS

| | | | |
|---|---|---|---|
| 2009/0032937 A1* | 2/2009 | Mann | H01L 23/4735 257/712 |
| 2009/0071952 A1* | 3/2009 | Kuwabara | H05B 1/0233 219/494 |
| 2014/0043765 A1* | 2/2014 | Gohara | H01L 23/3735 361/699 |
| 2014/0124182 A1* | 5/2014 | Kwak | H01L 23/473 165/168 |

* cited by examiner

Section A-A →

PACKAGING AND COOLING METHOD AND APPARATUS FOR POWER SEMICONDUCTOR DEVICES

BACKGROUND OF THE DISCLOSURE

Power semiconductor devices are electronic devices used as switches or rectifiers in power electronic circuits for operation of power converters. Due to the nature of the devices, the production of high power inevitably results in device power dissipation which can damage the device and/or impair its performance. To that end, packaging and cooling technology solutions are employed for the removal or dissipation of heat generated by power semiconductor devices. It is desirable to maximize the effectiveness of the heat transfer medium and minimize the size of the heat exchanger.

TECHNICAL FIELD OF THE DISCLOSURE

The present invention relates to a method and apparatus for heat removal and cooling of electronic packages or components.

DESCRIPTION OF THE RELATED ART

Heat exchange mechanisms, or heat sinks, are commonly used for maintenance of device temperature resulting in heat removal or dissipation. Common configurations of a heat sink consist of a mounting plate with parallel fins, lanced offset fins, or pin fins which when air or liquid coolant flows across or through the fins, it results in the transfer of heat from the power semiconductor device to the cooling media.

When a coolant or fluid such as air, water, or oil is forced to flow through the fins which are attached to a plate, heat can be efficiently transferred from the plate to the fluid serving to cool the plate and any heat source which is in thermal contact with the plate. The temperature difference between the plate and the incoming fluid is proportionate to the power dissipation, where the proportionality constant is known as the thermal impedance. By minimizing this constant, heat dissipation is maximized for a given temperature rise.

Thermal impedance can be approximated as the sum of three terms. The first, TC, is the result of finite thermal conductivity of the coolant; the second, TM, is the result of finite thermal mass of the coolant; and the third, TR, is due to the thermal resistance of the fin material.

In the case where fins are relatively close together, the fluid flow is typically laminar. In this case, the value of TC is approximately equal to one fourth the fin spacing divided by the product of the fluid thermal conductivity and the total fin area. From this, it follows that TC varies as the reciprocal square of the number of fins per unit length. Accordingly, when the number of fins attached to a given plate is doubled, TC is reduced by a factor of four.

The second term, TM, varies inversely with the coolant volumetric flow rate. With zero flow this term is infinite. Pressure drop (head loss) is proportionate to the product of coolant viscosity, volumetric flow rate and fin length and inverse with the product of total flow section and the square of the number of fins. The third term, TR, is proportionate to the fin height and inverse with the number of fins and the cross section of each fin.

Based on the foregoing, it can be concluded that fin length should always be minimized, and if possible, fins should run parallel to the width dimension of a plate, rather than parallel to the length dimension, assuming that width is less than length. For a given plate area, as fin length is reduced, flow cross section automatically increases. This allows the volumetric flow rate to increase and fin spacing to be reduced while maintaining constant head loss—which in turn results in reduced values of TC and TM. When TC and TM are approximately equal, optimized designs occur.

In conventional electronic applications, power semiconductors must be electrically insulated from a heat sink. The required insulation materials add significantly to the thermal impedance and the cost.

With many power electronic applications, leakage inductance associated with the interconnection of the power semiconductors and related components is critical. Even relatively small values of leakage inductance can result in voltage spikes which require that component voltage ratings be increased or that snubber circuits be added thereby adding to the cost and size.

In light of the foregoing, there is a need for an improved electronic application for power semiconductor devices that eliminates thermal and cost penalties associated with insulation materials, and enables higher voltage withstand capabilities. This needed application would eliminate the need for electrical insulation placed between semiconductor devices and heat sinks, and by allowing each semiconductor element to remain electrically "hot," would achieve an additional reduction in overall thermal impedance. This application would enable fin length to be reduced to relatively small values which, in turn, would enable both fin density and the coolant flow rate to increase resulting in respective decreases of TC and TM.

This needed application will employ the use of multiple parallel connected power devices combined with the use of a multi-layer circuit board for power busing which will allow for leakage inductances to be maintained at extremely low values. A circuit board in such an application would perform as a low impedance transmission line such that termination leakage inductances would be extremely small.

As a result of the combination of efficient heat transfer and low leakage inductance, the improved application would enable both high power density and low cost power electronic systems to be designed, particularly for power devices such as insulated-gate bipolar transistors (IGBT) and metal-oxide-semiconductor field-effect transistor (MOSFET), where currents are typically limited by thermal constraints and not by turn-on or turn-off safe operating limits.

SUMMARY OF THE INVENTION

To minimize the limitations found in the prior art, and to minimize other limitations that will be apparent upon the reading of the specifications, the preferred embodiment of the present invention provides a packaging and cooling apparatus comprised of a semiconductor module attached to a circuit board. The semiconductor module is comprised of a fluid manifold and at least one semiconductor element having a plate, a fin, and at least one power semiconductor device attached. The width of the plate is less than its length, and the length of the fin attached to the plate is less than the width of the plate. A plate is attached to at least one side of each semiconductor element. For each semiconductor element, a fin is solder bonded to one side of each plate. At least one semiconductor device is attached to the reverse side of the plate. One embodiment of the fluid manifold is comprised of a top manifold portion, a center manifold portion, a bottom manifold portion, having at least one semiconductor element and at least one branch.

In another aspect of the present invention, a method in accordance with the present invention is a method for packaging and cooling power semiconductor devices. Terminals projecting from the semiconductor module pass through holes in the circuit board and are soldered to traces to attach the semiconductor module to the circuit board. Fins are oriented such that their length axis or fluid flow direction is parallel to the width axis of a plate. The fluid manifold serves to direct the coolant through the fins. In the present invention, the coolant enters the top manifold portion via an inlet and is horizontally distributed via a cavity within the top manifold to the upper end of a fin. The coolant then flows vertically downward through a fin and enters the cavity associated with the bottom manifold portion where it flows horizontally and exits via an outlet. A connecting separator serves to unite the front and rear terminals of the manifold element while acting as an added insulation barrier between opposing fins. The semiconductor module and circuit board can be surrounded by a potting material to prevent leakage of the coolant.

In another embodiment of the invention, a semiconductor module having at least one semiconductor element is mated to a non-conductive fluid manifold and has an elastomeric seal such as an o-ring which seals the plate to the manifold.

In an alternate embodiment of the invention, the semiconductor module and circuit board are dip-coated to prevent leakage of the coolant.

One objective of the invention is to provide a semiconductor module eliminating the need for electrical insulation between a semiconductor device and a heat sink.

Another objective of the invention is to provide a semiconductor module that provides increased reduction in thermal impedance.

Another objective of the invention is to provide a semiconductor module which employs the use of fin structure and orientation to increase the flow and effectiveness of a coolant.

Another objective of the invention is to provide a low cost solution for power electronic applications.

Still another objective of the invention is to provide a low cost power electronic application capable of maintaining low level leakage inductances.

These and other advantages and features of the present invention are described with specificity so as to make the present invention understandable to one of ordinary skill in the art.

BRIEF DESCRIPTION OF THE DRAWINGS

Elements in the figures have not necessarily been drawn to scale in order to enhance their clarity and improve understanding of these various elements and embodiments of the invention. Furthermore, elements that are known to be common and well understood to those in the industry are not depicted in order to provide a clear view of the various embodiments of the invention, thus the drawings are generalized in form in the interest of clarity and conciseness.

DETAILED DESCRIPTION OF THE DRAWINGS

In the following discussion that addresses a number of embodiments and applications of the present invention, reference is made to the accompanying drawings that form a part hereof, and in which is shown by way of illustration specific embodiments in which the invention may be practiced. It is to be understood that other embodiments may be utilized and changes may be made without departing from the scope of the present invention.

Various inventive features are described below that can each be used independently of one another or in combination with other features. However, any single inventive feature may not address any of the problems discussed above or only address one of the problems discussed above. Further, one or more of the problems discussed above may not be fully addressed by any of the features described below.

Figure 1:
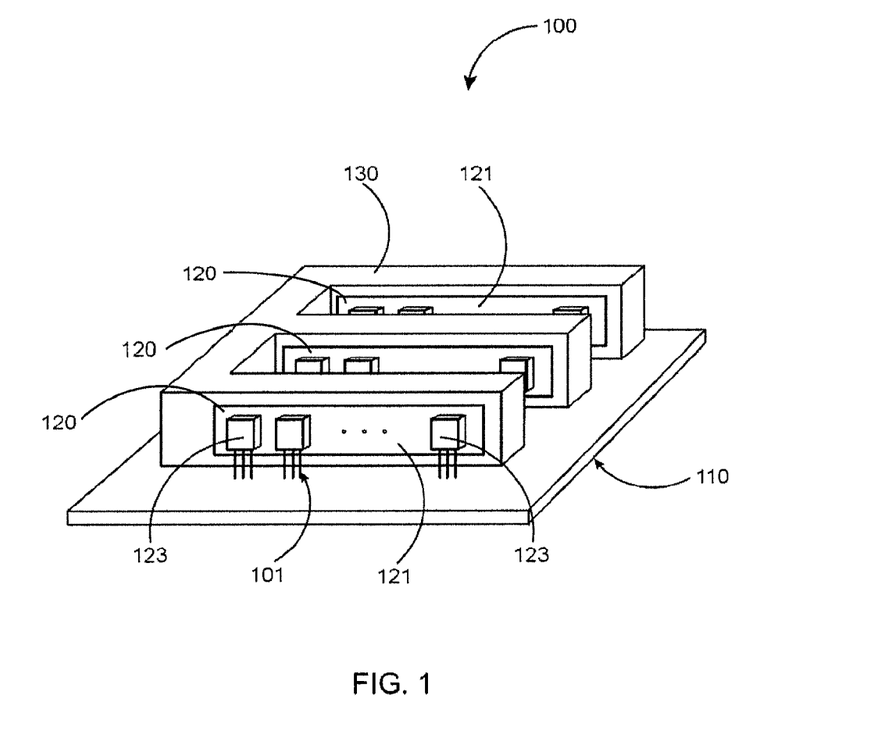
FIG. 1 illustrates a perspective view of a packaging and cooling apparatus in accordance with the present invention.

FIG. 1 shows a packaging and cooling apparatus comprised of a semiconductor module 100 and a circuit board 110. Terminals 101 which project from the semiconductor module 100 pass through holes (not shown) in the circuit board 110 and are soldered to traces (not shown) using conventional techniques. In turn, the semiconductor module 100 is comprised of at least one semiconductor element 120 and a fluid manifold 130. In this illustration, there are six semiconductor elements 120 (two on each of the three legs) which is typical for a three-phase inverter.

Figure 2:
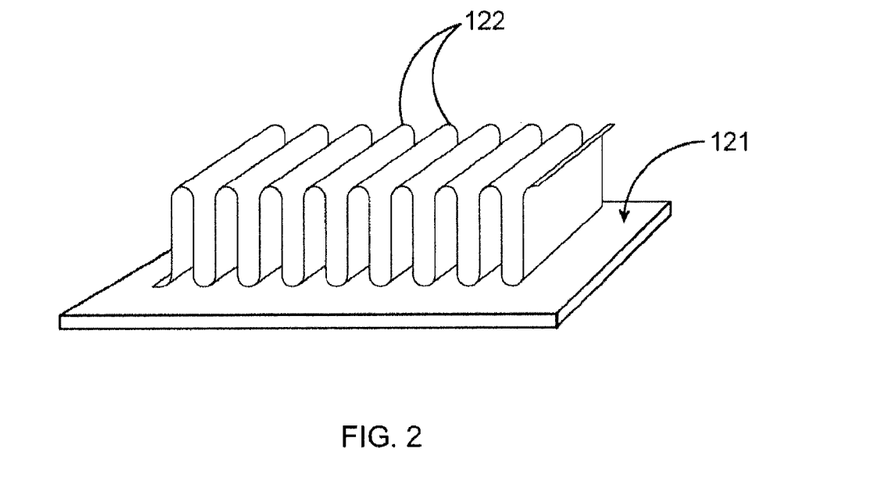
FIG. 2 illustrates a perspective view of a serpentine fin structure in accordance with the present invention.

FIG. 2 shows a serpentine fin structure comprising a serpentine fin 122 made of copper or aluminum, which is bonded to a flat metal plate 121, also typically copper or aluminum. Alternatively, the metal plate 121 may be a direct-bond copper (DBC) substrate in which the plate 121 has a thermally conductive ceramic core and copper layers on each side of the ceramic core. Bonding of the fin 122 to the metal plate 121 can be accomplished by soldering, dip brazing, vacuum brazing or conductive adhesive. In another embodiment, a similar one-piece structure may be created by casting or molding metal.

Figure 3:
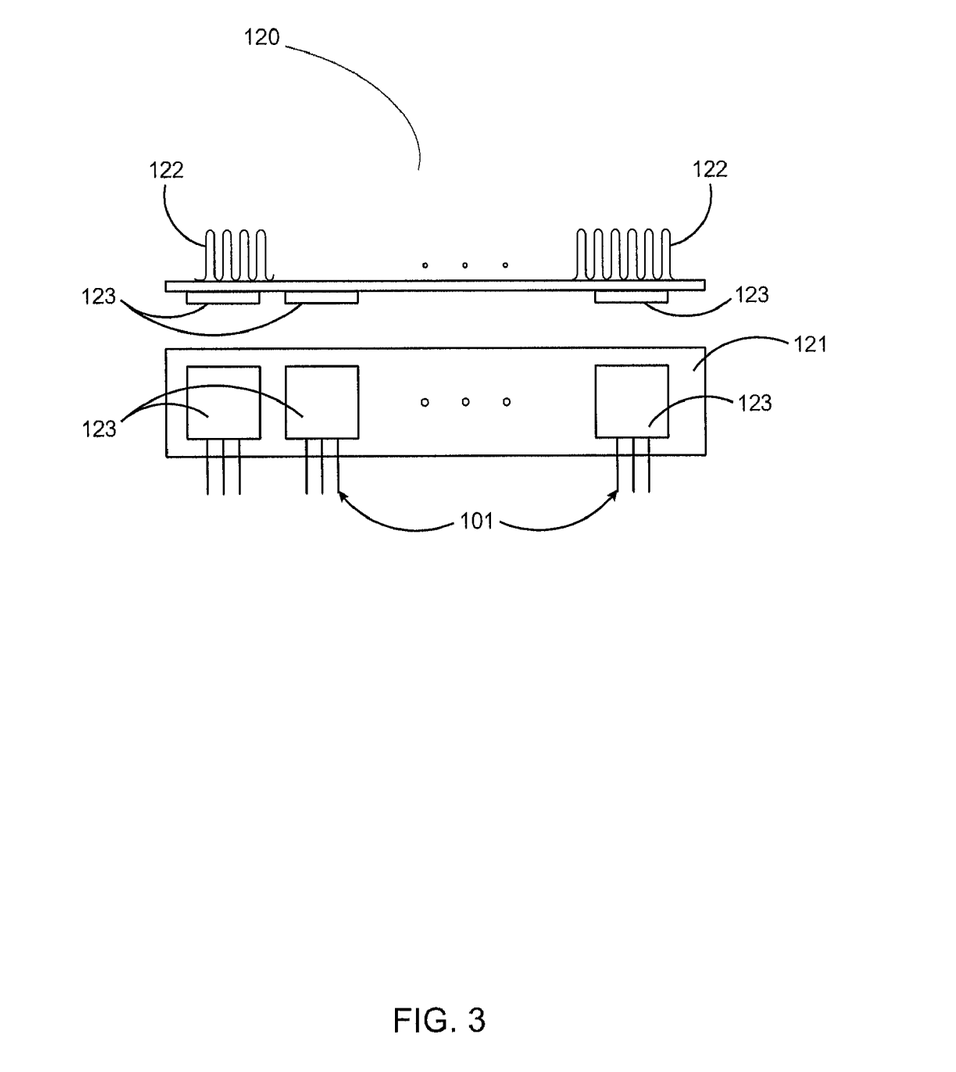
FIG. 3 illustrates two views of a single semiconductor element in accordance with the present invention.

As shown in FIG. 3, each semiconductor element 120 consists of a flat metal plate 121, at least one serpentine fin 122, and at least one power semiconductor device 123. The metal plate 121 is designed such that the dimension of its width is less than the dimension of its length. In turn, the serpentine fin 122 is structured such that the fin 122 length is less than the width of the metal plate 121. For each semiconductor element 120, at least one serpentine fin 122 is bonded to one side of the metal plate 121, while at least one power semiconductor device 123 is bonded to the opposing side of the metal plate 121. Bonding of the power semiconductor device 123 to the metal plate 121 is typically limited to soldering due to temperature limitations of the power semiconductor device 123. Bonding may also be achieved with a conductive adhesive. In one alternative method, the semiconductors 123 may be clamped to the flat metal plate 121 instead of soldering, preferably with thermally conductive paste or grease at the interface.

Figure 4A:
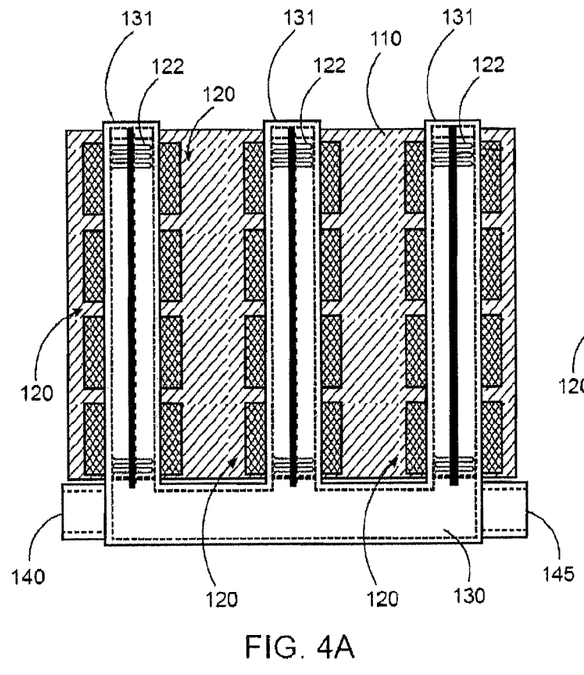
FIG. 4A illustrates a top view of six semiconductor elements and fluid manifold in accordance with the present invention.
Figure 4B:
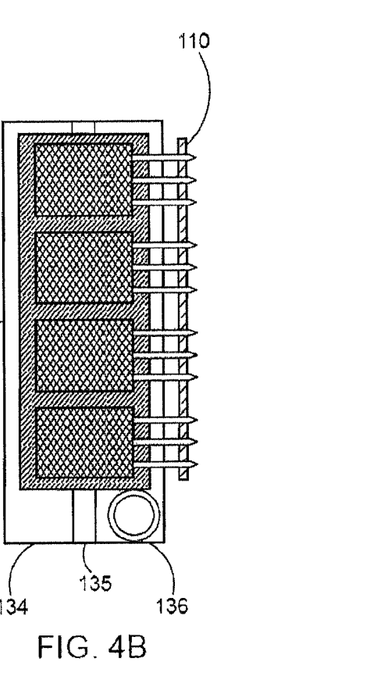
FIGS. 4B and 4C illustrate side views of the semiconductor elements and fluid manifold in accordance with the present invention.
Figure 4C:
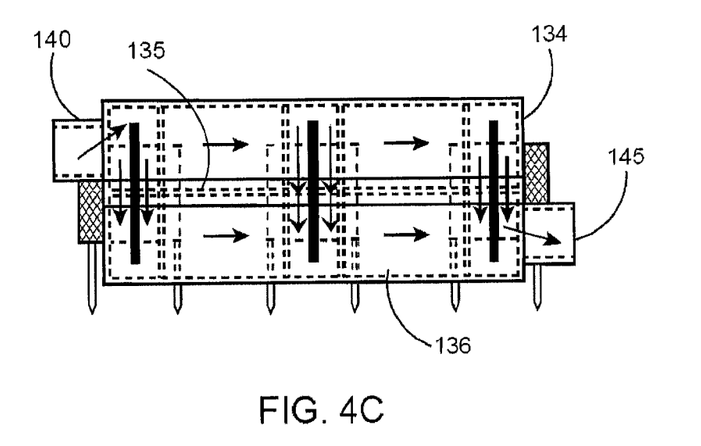

FIGS. 4A, 4B and 4C display the fluid manifold 130 of the present invention which contains at least one semiconductor element 120, and serves to direct a coolant (not shown) which can be air, water, or oil, through the fins 122 attached to each semiconductor element 120. The fluid manifold 130 can have a plurality of branches 131. FIG. 4A depicts three branches 131 with six semiconductor elements 120. The fluid manifold 130 consists of three sub-elements, a top manifold portion 134, a center manifold portion 135, and a bottom manifold portion 136. In the present embodiment, the coolant (not shown) enters the top manifold portion 134 via an inlet 140 and is horizontally distributed via the cavity within the top manifold portion to the upper ends of the six serpentine fins 122. The coolant (not shown) then flows vertically downward through each of the fins 122 and enters the cavity within the bottom manifold portion 136, where it then flows horizontally and exits via an outlet 145, as shown in FIG. 4C.

Figure 5:
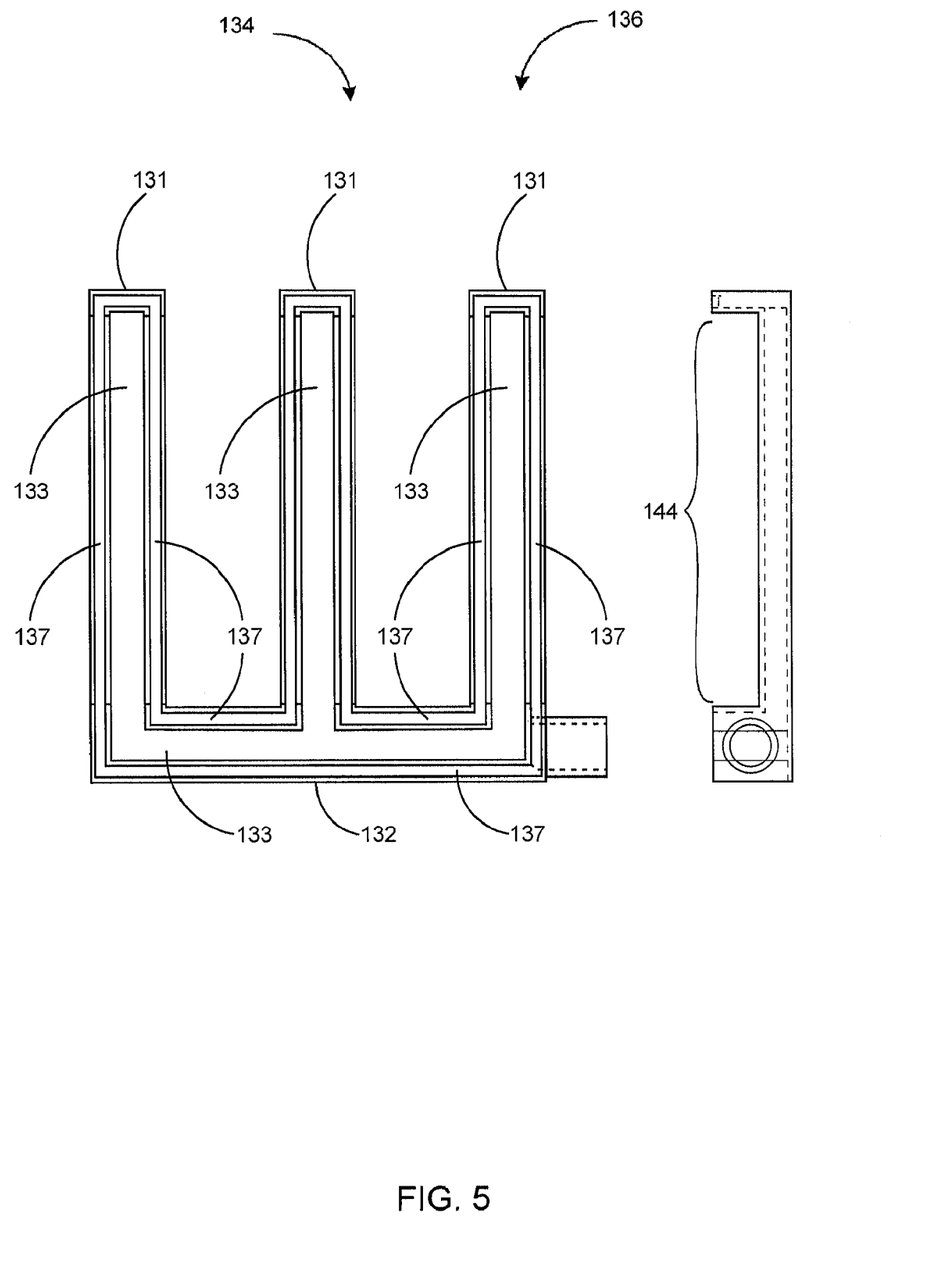
FIG. 5 illustrates top and side views of the bottom manifold (same as top manifold) in accordance with the present invention.

FIG. 5 shows a bottom manifold portion 136 (same as top manifold 134). In the present embodiment the top manifold portion 134 in FIGS. 4B and 4C and the bottom manifold portion 136 are identical, however, they may be designed to differ in an alternate embodiment of the invention. The top manifold portion 134 and the bottom manifold portion 136 each have a plurality of branches 131 and a connecting member 132. The plurality of branches 131 and the connecting member 132 include a contiguous cavity 133 which serves to direct the coolant (not shown) to and from the fins 122. The top manifold portion 134 and the bottom manifold portion 136 include grooves 137 which serve to receive the flat metal plate 121, and which also engage with the pronged elements 142 of the center manifold portion 135 (depicted in FIG. 6B). The grooves 137 are not necessary if o-rings and clamps are used to seal the flat plate 121 to the manifold 130.

Figure 6A:
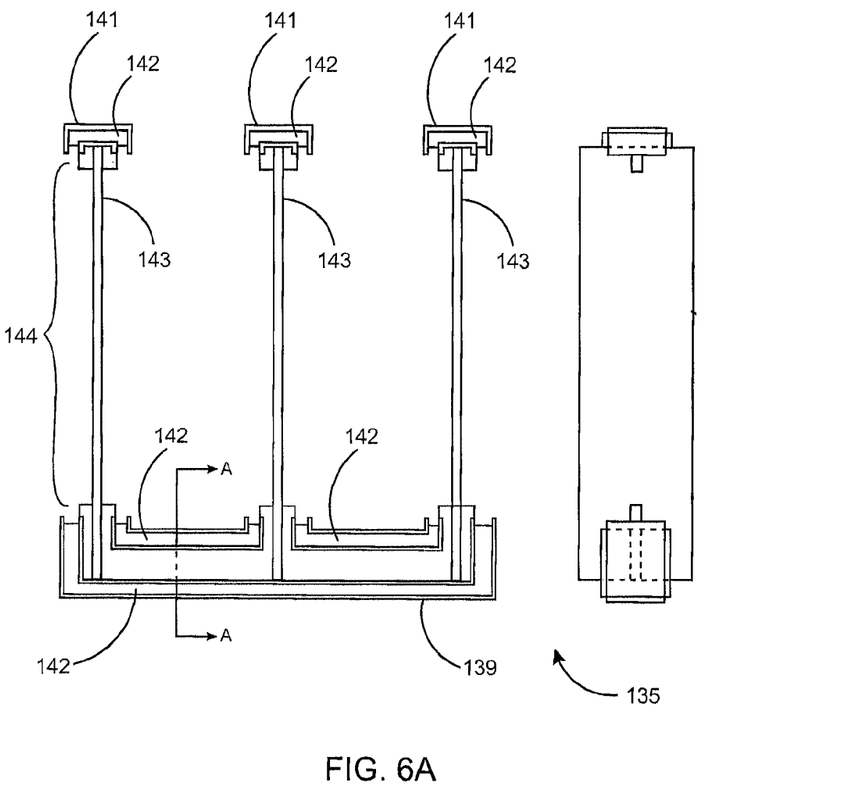
FIG. 6A illustrates top and side views of the center manifold portion in accordance with the present invention.

FIG. 6A displays the front section 139, rear section 141, pronged walls 142, and connecting separator 143 of the center manifold portion 135. The front section 139 may be a one piece molded assembly or may be comprised of individual pieces. Pronged walls 142 engage with grooves 137 (depicted in FIG. 5) contained in the both the bottom manifold portion 136 (depicted in FIG. 5) and the top manifold portion 134. Connecting separators 143 serve to unite the front and rear sections 139, 141 while acting as an insulation barrier between opposing fins 122.

Figure 6B:
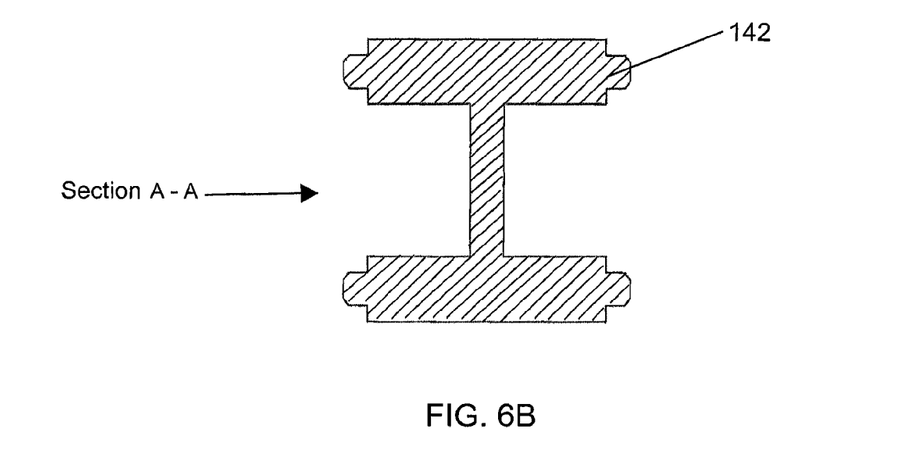
FIG. 6B illustrates a sectional view (A-A) of the center manifold portion in accordance with the present invention.

FIG. 6B shows a cross section of center manifold portion 135. The bottom manifold portion 136 and center manifold portion 135 are first assembled. Then the semiconductor elements 120 are inserted in respective windows 144 formed by the previous assembly. The top manifold portion 134 is then pressed into place completing the assembly of the fluid manifold 130.

Figure 7A:
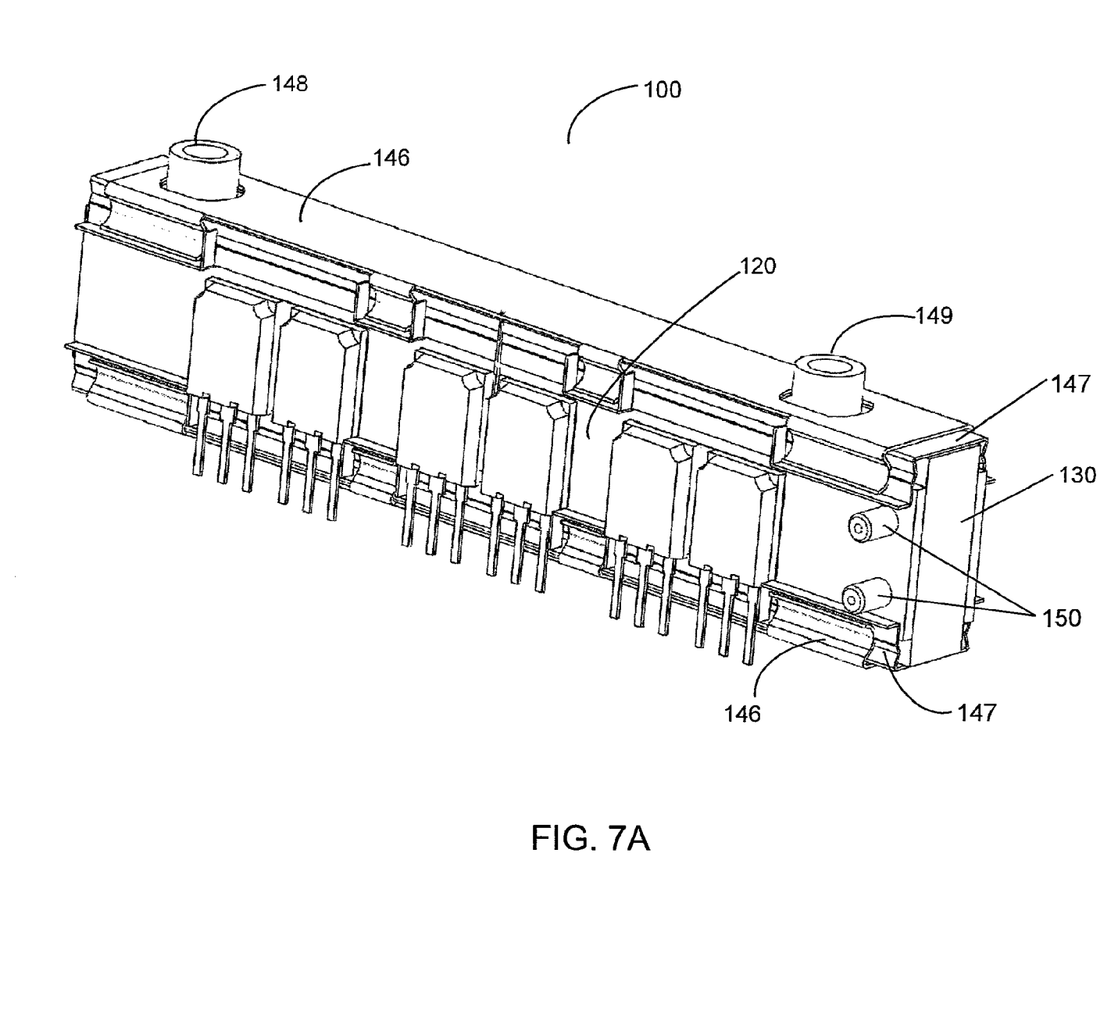
FIGS. 7A and 7B illustrate a perspective view and a section view of another embodiment of the present invention.
Figure 7B:
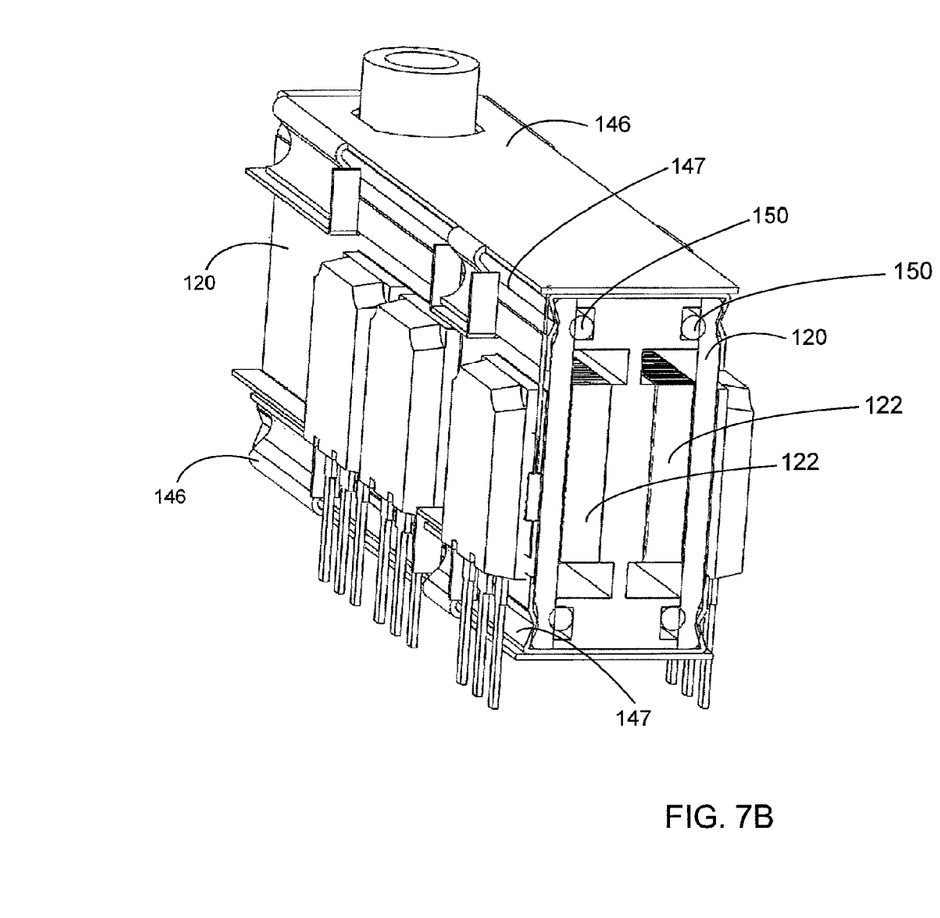
Figure 7C:
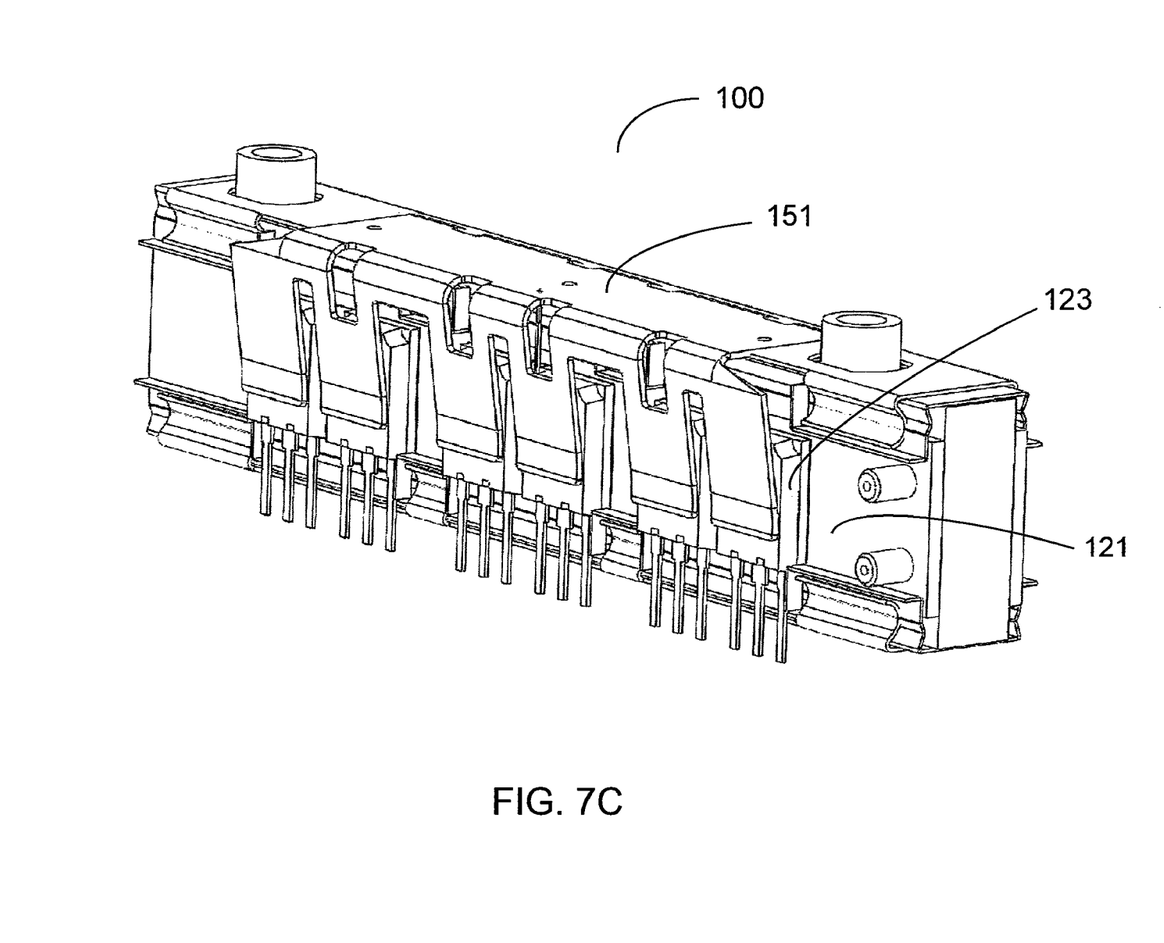
FIG. 7C illustrates the use of a spring clip to hold semiconductor devices against the heat sink plate if necessary.

FIG. 7A shows another embodiment of the invention where a semiconductor module 100 having at least one semiconductor element 120 and a fluid manifold 130 which are clamped together using one or more spring clamps 146. The clamp 146 may be non-conductive or insulated if necessary so as not to short to a second semiconductor module on the opposite side of the manifold 130. In this embodiment, the metal clamp 146 has an insulator 147. Cooling fluid enters port 148 and exits port 149. Optional electrical terminals 150 may be used for connection to the semiconductor module. FIG. 7B illustrates a cross section of the semiconductor module 100, showing the first and an optional second semiconductor element 120. An o-ring 150 seals each semiconductor element 120 against the wall opening of the fluid manifold 130. No potting material is required for this embodiment. FIG. 7C illustrates the optional use of a spring clip 151 to apply pressure to each semiconductor device 123 against the heat sink plate 121. This is required if the semiconductor devices 123 are not soldered or conductively bonded to the heat sink plate 121. Use of a heat transfer paste or adhesive is typically used between the semiconductor devices 123 and the heat sink plate 121 if the semiconductor devices 123 are not soldered to the plate 121.

The foregoing description of the preferred embodiments of the present invention has been presented for the purpose of illustration and description. It is not intended to be exhaustive or to limit the invention to the precise form disclosed. Many modifications and variations are possible in light of the above teachings. It is intended that the scope of the present invention not be limited by this detailed description, but by the claims and the equivalents to the claims appended hereto.

What is claimed is:

1. A power semiconductor packaging and cooling apparatus comprising:
   a printed circuit board; and
   a semiconductor module comprising:
      at least one semiconductor element, comprising:
         at least one power semiconductor device;
         a plurality of terminals protruding from the bottom of the power semiconductor devices;
         at least one thermally conductive plate; and
         at least one serpentine fin element, each serpentine fin element being defined by a plurality of folds;
      a manifold element, the manifold element being defined by at least one portion; the manifold element comprising:
         a fluid inlet port designed for receiving a coolant and transporting it to the serpentine fin elements;
         a fluid outlet port to allow for the release of the coolant; and
         at least one window designed to receive the semiconductor element or elements;
   wherein the plurality of terminals pass through corresponding holes in the circuit board to connect the semiconductor module to the circuit board;
   wherein each semiconductor device is bonded to one side of each thermally conductive plate, and each serpentine fin element is bonded to the opposing side of each thermally conductive plate to form one or more plate assemblies; and
   wherein each plate assembly is installed in the window of the manifold element allowing for the coolant entering the manifold element to be forced to flow through each of the serpentine fin elements, providing heat removal from each of the attached power semiconductor devices.

2. The apparatus of claim 1 wherein the power semiconductor devices interconnect with each other and to external components via the printed circuit board.

3. The apparatus of claim 1 wherein at least two semiconductor devices are connected in parallel to allow the handling of increased electrical current.

4. The apparatus of claim 1 wherein the power semiconductor devices are connected to form at least one switching pole.

5. The apparatus of claim 4 wherein at least two switching poles are connected to form an inverter.

6. The apparatus of claim 1 wherein the power semiconductor devices are soldered to the thermally conductive plates to achieve bonding.

7. The apparatus of claim 1 wherein the power semiconductor devices are bonded with a thermally conductive adhesive to the thermally conductive plates.

8. The apparatus of claim 1 wherein the power semiconductor devices are clamped to the thermally conductive plates.

9. The apparatus of claim 1 wherein the serpentine fin elements are soldered or brazed to the thermally conductive plates to achieve bonding.

10. The apparatus of claim 1 wherein the serpentine fin elements are bonded to the thermally conductive plates with thermally conductive adhesive.

11. The apparatus of claim 1 wherein the thermally conductive plates may be metal or Direct Bond Copper (DBC, i.e. copper/ceramic/copper lamination).

12. The apparatus of claim 1 wherein the coolant is oil.

13. The apparatus of claim 1 wherein the coolant is water or a mixture of water and other additives such as anti-freeze or anti-corrosion.

14. The apparatus of claim 1 wherein the coolant is air.

15. The apparatus of claim 1 wherein the apparatus is potted with a resin to prevent leakage of the coolant or sealed without potting using clamped o-rings, and wherein further a clamping force may be from a spring clip or a screw fastener.

16. The apparatus of claim 1 wherein the fold axes of the serpentine fin elements are parallel to the width axis of the thermally conductive plates.

17. The apparatus of claim 1 wherein the number of folds per unit length for each serpentine fin element is selected such that a given pressure drop (head loss) is achieved for a given coolant flowing at a given volumetric flow rate.

18. The apparatus of claim 1 wherein the manifold element is molded or machined from an electrically insulating material.

19. The apparatus of claim 1 wherein the manifold element is made from metal.

20. The apparatus of claim 1 wherein the fin elements can be copper or aluminum.

21. The apparatus of claim 1 wherein the thermally conductive plates can be copper or aluminum or a Direct Bond Copper (DBC) substrate.

22. The apparatus of claim 1 wherein the power semiconductor devices can be insulated-gate bipolar transistors (IGBTs), metal-oxide-semiconductor field-effect transistors (MOSFETs) or similar power transistors or diodes.

* * * * *